United States Patent [19]
Yoon

[11] Patent Number: 6,072,747
[45] Date of Patent: Jun. 6, 2000

[54] HIGH-SPEED CURRENT SETTING SYSTEMS AND METHODS FOR INTEGRATED CIRCUIT OUTPUT DRIVERS

[75] Inventor: Sun-byeong Yoon, Kyungki-do, Rep. of Korea

[73] Assignee: Samsung Electronics Co., Ltd., Rep. of Korea

[21] Appl. No.: 09/137,543

[22] Filed: Aug. 20, 1998

[30] Foreign Application Priority Data

Nov. 7, 1997 [KR] Rep. of Korea .................. 97-58795

[51] Int. Cl.[7] .................................................. G11C 8/00
[52] U.S. Cl. ........................ 365/230.06; 365/230.02; 365/230.03; 365/189.11
[58] Field of Search ..................... 365/230.06, 230.02, 365/230.03, 189.02, 189.11

[56] References Cited

U.S. PATENT DOCUMENTS

| | | | |
|---|---|---|---|
| 5,254,883 | 10/1993 | Horowitz et al. ................. | 307/443 |
| 5,473,575 | 12/1995 | Farmwald et al. ................ | 365/230.06 |
| 5,513,327 | 4/1996 | Farmwald et al. ............ | 365/189.02 X |
| 5,578,940 | 11/1996 | Dillon et al. ....................... | 326/30 |
| 5,606,717 | 2/1997 | Farmwald et al. ................. | 395/856 |
| 5,657,481 | 8/1997 | Farmwald et al. ............ | 365/230.02 X |
| 5,663,661 | 9/1997 | Dillon et al. ....................... | 326/30 |

*Primary Examiner*—Huan Hoang
*Attorney, Agent, or Firm*—Myers Bigel Sibley & Sajovec

[57] ABSTRACT

Current control systems and methods are provided for a plurality of integrated circuit devices that are commonly attached to a bus, including a plurality of signal lines. Each integrated circuit includes a plurality of output drivers, a respective one of which drives a respective one of the plurality of signal lines. Each integrated circuit includes a current setting circuit that sets an output current for each of the output drivers in the integrated circuit. A controlling circuit controls the current setting circuit in each integrated circuit, such that each current setting circuit simultaneously sets an output current for an output driver corresponding to a different one of the plurality of signal lines.

20 Claims, 3 Drawing Sheets

HIGH-SPEED CURRENT SETTING SYSTEMS AND METHODS FOR INTEGRATED CIRCUIT OUTPUT DRIVERS

FIELD OF THE INVENTION

This invention relates to integrated circuit devices such as integrated circuit memory devices, and more particularly to systems and methods for controlling output drivers of integrated circuit devices.

BACKGROUND OF THE INVENTION

Electronic systems including but not limited to data processing systems, often use buses including a plurality of signal lines, to interconnect integrated circuit devices, so that the integrated circuit devices can communicate with one another. Output drivers are generally included in the integrated circuits in order to drive signals that are internally generated in the integrated circuit onto the bus. These output drivers are generally driven by voltage level signals.

Recently, however, in order to achieve high speed operations and/or other advantages, integrated circuit devices that include current mode output drivers have been provided. The use of current mode output drivers can reduce the peak switching current and signal reflections on the bus, to thereby allow low power, high performance communications between integrated circuits.

One technology that uses current mode output drivers is the Rambus technology that is marketed by Rambus, Inc., Mountain View, Calif. The Rambus technology is described in U.S. Pat. No. 5,473,575 to Farmwald et al., U.S. Pat. No. 5,578,940 to Dillon et al., U.S. Pat. No. 5,606,717 to Farmwald et al. and U.S. Pat. No. 5,663,661 to Dillon et al. A device embodying the Rambus technology is also referred to as a "packet type integrated circuit device", because each integrated circuit receives data and addresses in packet units. Accordingly, integrated circuit devices that include current mode output drivers will also be referred to herein as "packet type integrated circuit devices".

FIG. 1 is a schematic diagram of a plurality of integrated circuit devices that are commonly attached to a bus, including a plurality of signal lines, wherein each integrated circuit includes current mode output drivers. More particularly, as shown in FIG. 1, the integrated circuit devices are a plurality of packet type memory devices 101–108 that are all connected to a bus, also referred to as a "channel", that includes a plurality of signal lines B1–Bn. A memory controller 109 also controls the memory devices 101–108 through the bus.

In integrated circuit devices that include current mode output drivers, initialization of the integrated circuit devices upon power-up may consume an excessive amount of time. In particular, in current mode drivers, the current can often vary from driver to driver. Variations may also take place over time. Temperature variations, process variations and/or power supply variations may cause these variations. These current variations may, in turn, lead to voltage level variations on the bus that can result in loss of data and/or other errors.

Accordingly, upon power-up of a system including integrated circuit devices with current mode output drivers, it is generally desirable to set the output current for each of the output drivers in each of the integrated circuits. This current setting is generally performed as part of initialization. More specifically, for each output driver, the current setting operation can set the number of pull-down transistors to be turned on in the output driver in order to set a characteristic impedance and a target output low voltage (VOL) of the integrated circuit device.

A system for setting current in current mode output drivers of integrated circuits is described in U.S. Pat. No. 5,254,883 to Horowitz et al., entitled "Electrical Current Source Circuitry for a Bus", the disclosure of which is hereby incorporated herein by reference. FIG. 2 is a schematic diagram illustrating a conventional current control system, as described in the above-cited U.S. Pat. No. 5,254,883. For ease of explanation, in FIG. 2 only circuits related to the current control for output drivers are shown.

Referring to FIG. 2, a conventional packet type integrated circuit device includes a request packet analyzer 201, a register read and current control enable circuit 203, a logic circuit 205, an output driver 207, a current control circuit 209, a reference pad 211 and an output pad 213.

For the current control of the output driver 207 connected to the output pad 213, a request packet RP is input to the request packet analyzer 201, and the request packet analyzer 201 analyzes the request packet RP. The register read and current control enable circuit 203 generates a current control enable signal CCE and a control signal RR in response to the output of the request packet analyzer 201.

The logic circuit 205 receives the control signal RR and current control bits ICTR0 through ICTR5, generated by the current control circuit 209, to generate control signals Q0 through Q5 that control the current driving capability of the output driver 207. The target VOL (output low voltage), which represents the current driving capability of the output driver 207, is determined in response to the control signals Q0 through Q5, and the output diver 207 drives the output pad 213 to set the target VOL. The current control circuit 209 receives the voltage VOL1 of the pad 213 and a voltage Vt applied to the reference pad 211, to generate the current control bits ICTR0 through ICTR5 in response to the current control enable signal CCE. Further details of operation of the system of FIG. 2 may be found in the above-cited U.S. Pat. No. 5,254,883.

Unfortunately, initializing all of the output drivers in all of the integrated circuit devices that are attached to the bus may consume excessive time. For example, if there are N output pads in each integrated circuit device, then current setting is generally performed N times for each integrated circuit device. If there are eight integrated circuit memory devices attached to a bus, 8N time periods of current controlling may be needed. This time may be excessive for high performance systems.

SUMMARY OF THE INVENTION

It is therefore an object of the present invention to provide improved current setting systems and methods for integrated circuit devices that contain current mode output drivers.

It is another object of the invention to provide current setting systems and methods that can reduce the total time that may be needed to set the current in all of the current mode output drivers that are attached to a bus.

These and other objects are provided, according to the present invention, by controlling a current setting circuit in each integrated circuit, such that each current setting circuit simultaneously sets an output current for an output driver corresponding to a different one of the signal lines in the bus. Accordingly, multiple current mode output drivers may be set simultaneously, as long as each current driver drives a different line on the bus. The total time for setting the current in all of the current mode output drivers in the system can therefore be reduced.

More specifically, the present invention provides current control systems and methods for a plurality of integrated circuit devices that are commonly attached to a bus, including a plurality of signal lines. Each integrated circuit includes a plurality of output drivers, a respective one of which drives a respective one of the plurality of signal lines. Each integrated circuit includes a current setting circuit that sets an output current for each of the output drivers in the integrated circuit. A controlling circuit controls the current setting circuit in each integrated circuit, such that each current setting circuit simultaneously sets an output current for an output driver corresponding to a different one of the plurality of signal lines. Thus, for example, if there are N current mode output drivers in each integrated circuit device, and there are eight integrated circuit devices attached to the bus, N periods rather than 8N periods may be used to set the current in all of the output drivers. The time for setting the current mode output drivers may thereby be decreased so that system performance may be increased.

In a preferred embodiment of the present invention, the controlling circuit includes an address register that stores therein identity address bits, and a multiplexer that is responsive to the address register to select one of the output drivers. Each integrated circuit preferably stores therein identity address bits, only one of which is preferably at a first logic level and the remaining ones of which are at a second logic level. The identity address bits are used by the multiplexer to output one of a plurality of target output low voltages (VOL) that is used by the current setting circuit to set the output current for a corresponding output driver in the integrated circuit.

The current setting circuit preferably includes a request packet analyzer that receives and analyzes a request packet. A current control enable circuit generates a current control enable signal in response to the request packet analyzer. A current control circuit generates current control bits in response to the current control enable signal and to the multiplexer. Finally, a logic unit is connected between the address register and the plurality of output drivers, to control the output currents for the plurality of output drivers in response to the current control bits and the address register.

The logic unit preferably includes a data register that is responsive to the address register and to the current control enable signal. An inverter inverts the output of the data register. A plurality of NAND gates generate control signals to control the output driver in response to the inverter and the current control bits.

The current control circuit preferably includes a first transfer gate that is responsive to a first reference voltage and to the current control enable signal, and a second transfer gate that is responsive to the multiplexer and to the current control enable signal. First and second resistors are serially connected between the first and second transfer gates to define a node therebetween. A comparator is connected to the node, to compare the voltage at the node to a second reference voltage. An up/down counter generates the current control bits in response to the comparator.

In preferred embodiments of the present invention, the integrated circuit devices are integrated circuit memory devices, and more preferably packet type integrated circuit memory devices. However, it will be understood that the present invention may be used with any integrated circuit devices that use current mode output drivers that are set upon power-up. The present invention can reduce the total amount of time to set the current mode output drivers, thereby allowing improvements in performance of the integrated circuit devices.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein;

rather, these embodiments are provided so that this disclosure will be thorough and complete, and will fully convey the scope of the invention to those skilled in the art.

Like numbers refer to like elements throughout. Each embodiment described and illustrated herein includes its complementary conductivity type embodiment as well.

Figure 3:
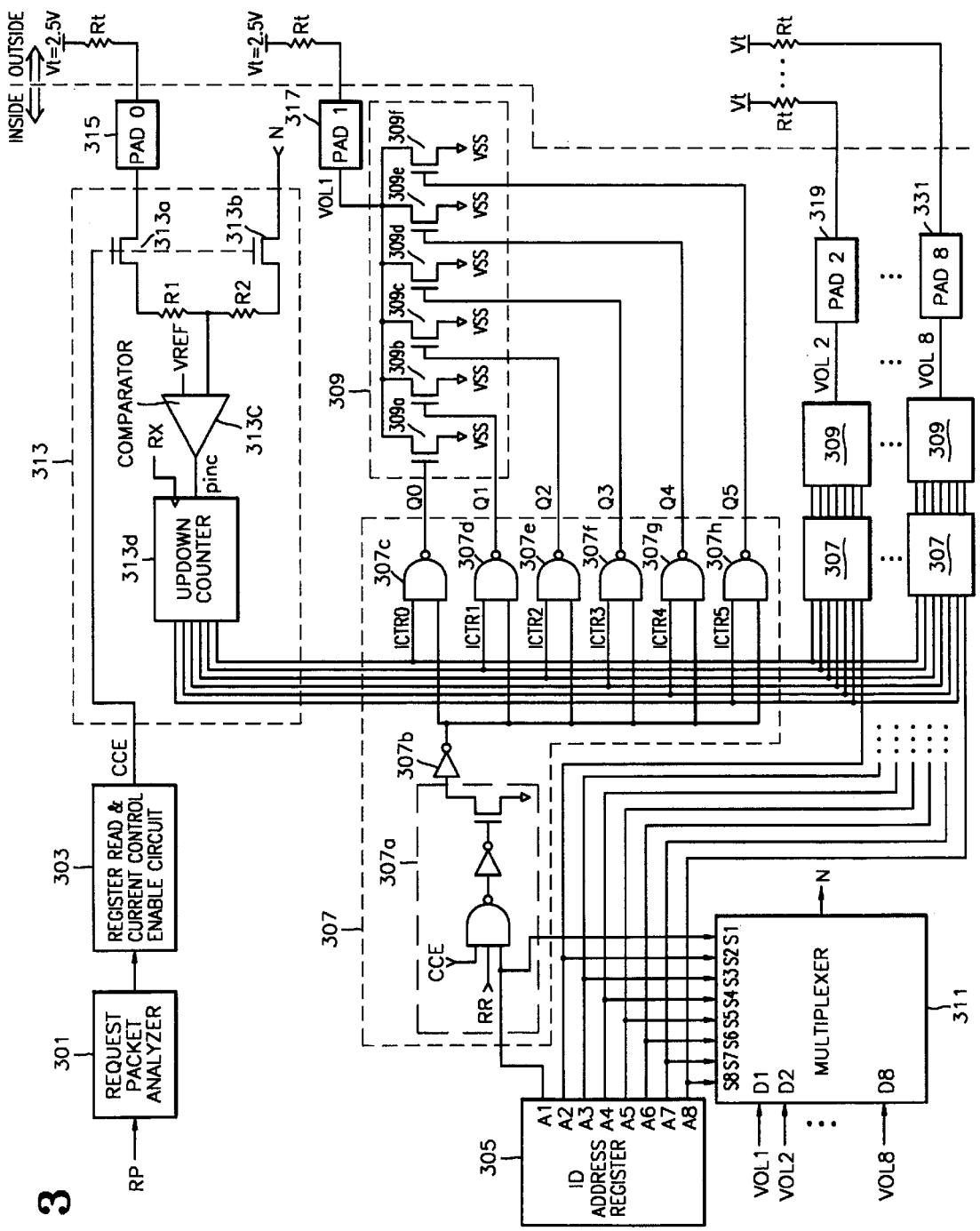
FIG. 3 is a schematic diagram of current controlling systems and methods according to the present invention.

FIG. 3 is a schematic diagram of current controlling systems and methods according to the present invention. Although FIG. 3 describes an embodiment for a packet type semiconductor memory device, it will be understood that the present invention may be used with any integrated circuit device that uses current mode output drivers, the output currents of which are set upon power-up or at other times during operation. It will also be understood that in FIG. 3, only circuits relating to the current control of an output driver are shown. The design and operation of the remainder of the integrated circuit device are well known to those having skill in the art.

Referring now to FIG. 3, packet type integrated circuit memory devices according to an embodiment of the present invention include a request packet analyzer 301, a register read and current control enable circuit 303, an identity (ID) address register 305, a plurality of logic circuits 307, a plurality of output drivers 309, a multiplexer 311, a current control circuit 313, a reference pad 315 and output pads 317, 319, 321, 323, 325, 327, 329 and 331.

In order to control current of the output drivers connected to the pads 317 through 331, a request packet RP is input. The request packet analyzer 301 receives the request packet RP and analyzes the request packet RP. The register read and current control enable circuit 303 generates a current control enable signal CCE in response to the output of the request packet analyzer 301.

Figure 1:
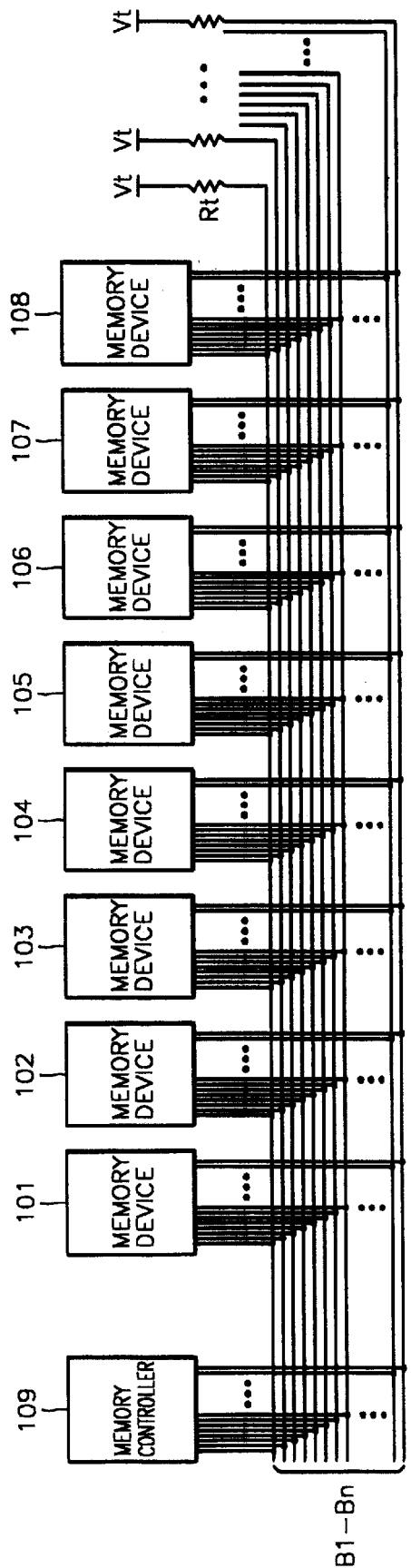
FIG. 1 is a schematic diagram of a plurality of integrated circuit devices that are commonly attached to a bus including a plurality of signal lines.
Figure 2:
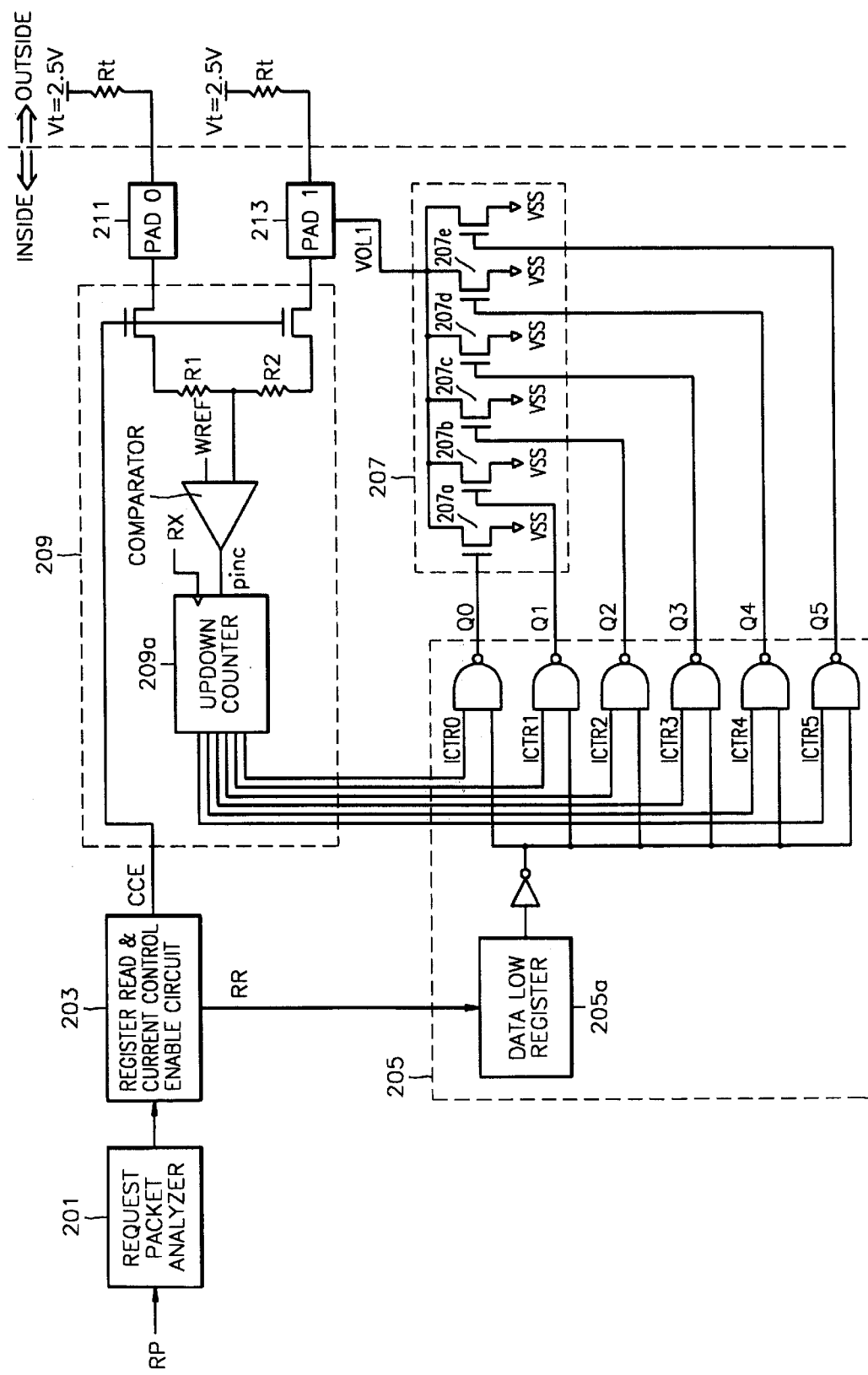
FIG. 2 is a schematic diagram of a conventional current setting circuit for integrated circuit devices including current mode output drivers.

The ID address register 305 stores ID addresses A1 through A8 applied during an ID address write cycle. In FIG. 3, eight bits of ID address are shown. Each of the packet type memory devices connected to one bus, as shown in FIG. 1, has an ID address. During the operation for initializing an integrated circuit device, an ID address is provided to each packet type memory device connected to the bus. Thus, if eight packet type memory devices are connected to the bus, then each ID address is stored sequentially in respective address registers of all the memory devices.

Each logic circuit 307 receives one bit among the ID addresses A1 through A8 stored in the ID address register 305, e.g., A1, and current control bits ICTR0 through ICTR5 generated by the current control circuit 313, to generate control signals Q0 through Q5 that set the current driving capability of the associated output driver 309. The target voltage VOL (output low voltage), which represents the current driving capability of the associated output driver 309, is determined in response to the control signals Q0 through Q5, and the associated output driver 309 drives the associated pad 317–331 to set the target voltage VOL. That is, each output driver 309 drives the pad 317–331 connected to its own output in response to one bit among the ID addresses A1 through A8 stored in the ID address register 305 and the current control bits ICTR0 through ICTR5.

The multiplexer 311 selectively outputs one of the outputs VOL1 of the output driver 309 and the outputs VOL2 through VOL8 of other output drivers in response to the ID addresses A1 through A8 stored in the ID address register 305. The current control circuit 313 receives the output N of the multiplexer 311 and a reference voltage Vt that is applied to the reference pad 315, to generate the current control bits ICTR0 through ICTR5, in response to the current control enable signal CCE.

Each logic circuit 307 includes a data low register 307a, an inverter 307b and NAND gates 307c through 307h. The output of the data low register 307a becomes active (logic low) when the corresponding bit A1, the current control enable signal CCE, and a predetermined control signal RR, are all active (logic high). The inverter 307b inverts the output of the data low register 107a. The NAND gates 307c through 307h perform NAND operations on the current control bits ICTR0 through ICTR5, respectively, and the output of the inverter 107b.

Each output driver 309 includes a plurality of pull-down NMOS transistors 309a through 309f that are connected in parallel between the pad 317 and ground voltage VSS. The pull-down NMOS transistors 309a through 309f preferably are of different sizes, such that the current driving capability of the output driver can be controlled by the control signals Q0 through Q5. For example, the NMOS transistor 309b is twice the size of the NMOS transistor 309a, the NMOS transistor 309c is twice the size of the NMOS transistor 309b, the NMOS transistor 309d is twice the size of the NMOS transistor 309c, the NMOS transistor 309e is twice the size of the NMOS transistor 309d, and the NMOS transistor 309f is twice the size of the NMOS transistor 309e.

The current control circuit 313 includes first and second transfer gates 313a and 313b, first and second resistors R1 and R2, a comparator 313c, and an up/down counter 313d. The first transfer gate 313a is an NMOS transistor, and transfers a predetermined voltage Vt, for example 2.5V, applied to the reference pad 315, in response to the current control enable signal CCE. The second transfer gate 313b is also an NMOS transistor, and transfers the output N of the multiplexer 311 in response to the current control enable signal CCE. The first and second resistors R1 and R2 are connected in series between the output ends of the first and second transfer gates 313a and 313b to define a node therebetween. The comparator 313c compares the voltage at the node between the first and second resistors R1 and R2 with a reference voltage VREF (approximately 2.1 V). The up/down counter 313d generates the current control bits ICTR0 through ICTR5 in response to an output pinc of the comparator 313c and a counter control signal RX.

For example, if the number of packet type semiconductor memory devices connected to one channel is 8 as in FIG. 1, the ID addresses A1 through A8 are stored in the respective address registers of the semiconductor memory devices. In the first semiconductor memory device, only the bit A1 among the ID addresses A1 through A8 is logic high while the remaining bits are all logic low, so that only the output driver 309 connected to the pad 317 is driven. As a result, the output VOL1 of the output driver 309 is determined.

For example, when the bit A1 is logic high, and the current control enable signal CCE and the control signal RR are both active (logic high), the control signals Q0 through Q5 become 011110 if the current control bits ICTR0 through ICTR5 are 100001. Accordingly, the pull-down NMOS transistors 309b through 309e of the output driver 309 are turned on, so that the output VOL1 of the output driver 309 is pulled down to a predetermined voltage VOL from the initial voltage Vt. Next, the multiplexer 311 selects and outputs the output VOL1 of the output driver 309, since the bit A1 is logic high. The current control circuit 313 changes the values of the current control bits ICTR0 through ICTR5 by comparing the output N of the multiplexer 311 and the voltage Vt applied to the reference pad 315. Thus, the current is set.

Simultaneously, in the second memory device, only the bit A2 among the ID addresses A1 through A8 is logic high, and the remaining bits are all logic low. Accordingly, only the output driver connected to the pad 319 is driven, so that the output VOL2 of that driver is set, in the same way as in the first memory device. The above operations are performed in all the memory devices simultaneously. These operations are then repeated with different ID addresses in subsequent cycles until all of the output driver currents are set.

Accordingly, output driver current setting is performed at the same time in all the memory devices connected to one bus. For example, if a system includes 8 packet type memory devices connected to a bus, and each memory device has N output pads, current setting is performed N times. Thus, the overall current setting time may be reduced and the system performance can be improved.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A current control system for a plurality of integrated circuit devices that are commonly attached to a bus including a plurality of signal lines, wherein each integrated circuit includes a plurality of output drivers, a respective one of which drives a respective one of the plurality of signal lines, the current control system comprising:

a current setting circuit in each integrated circuit that sets an output current for each of the output drivers in the integrated circuit; and a controlling circuit that controls the current setting circuit in each integrated circuit to simultaneously set an output current for an output driver corresponding to a different one of the plurality of signal lines, such that an output driver in each of the plurality of integrated circuit devices is set simultaneously.

2. A current control system according to claim 1 wherein the controlling circuit comprises:

an address register that stores therein identity address bits; and a multiplexer that is responsive to the address register to select one of the output drivers.

3. A current control system according to claim 2 wherein the current setting circuit comprises:

a request packet analyzer that receives and analyzes a request packet;

a current control enable circuit that generates a current control enable signal in response to the request packet analyzer;

a current control circuit that generates current control bits in response to the current control enable signal and the multiplexer; and a logic unit connected between the address register and the plurality of output drivers, to control the output currents for the plurality of output drivers in response to the current control bits and the address register.

4. A current control system according to claim 3 wherein the logic unit comprises:

a data register that is responsive to the address register and to the current control enable signal;

an inverter that inverts the output of the data register; and a plurality of NAND gates that generate control signals to control the output driver in response to the inverter and the current control bits.

5. A current control system according to claim 3 wherein the current control circuit comprises:

a first transfer gate that is responsive to a first reference voltage and to the current control enable signal;

a second transfer gate that is responsive to the multiplexer and to the current control enable signal;

first and second resistors that are serially connected between the first and second transfer gates to define a node therebetween;

a comparator that is connected to the node to compare the voltage at the node to a second reference voltage; and an up/down counter that generates the current control bits in response to the comparator.

6. A current control system according to claim 1 wherein each of the integrated circuit devices is an integrated circuit memory device.

7. A current control system according to claim 1 wherein each of the integrated circuit devices is a packet type integrated circuit memory device.

8. A packet type integrated circuit memory device comprising:

an address register that stores identity address bits;

a plurality of output drivers that drive respective integrated circuit memory device output pads in response to a corresponding output bit of the address register and current control bits;

a multiplexer that selects one of the output drivers in response to the output bits of the address register; and a current control circuit that generates the current control bits in response to a current control enable signal, the multiplexer and a first reference voltage.

9. A packet type integrated circuit memory device according to claim 8, further comprising:

a request packet analyzer that receives and analyzes a request packet;

a current control enable circuit that generates the current control enable signal in response to the request packet analyzer; and a plurality of logic units connected between the address register and the respective output drivers, each of which generates control signals that control the current driving capability of the corresponding output driver in response to the corresponding output bit of the address register and the current control bits.

10. A packet type integrated circuit memory device according to claim 9, wherein each logic unit comprises:

a data register, which is active when the corresponding output bit of the address register and the current control enable signal are active;

an inverter that inverts the output of the data register; and a plurality of NAND gates that generate the control signals by each performing a NAND operation on one of the current control bits and the output of the inverter.

11. A packet type integrated circuit memory device according to claim 8, wherein the current control circuit comprises:

a first transfer gate that transfers the first reference voltage in response to the current control enable signal;

a second transfer gate that transfers the output of the multiplexer in response to the current control enable signal;

first and second resistors connected in series between the first and second transfer gate to define a node therebetween;

a comparator that compares the voltage at the node with a second reference voltage; and an up/down counter that generates the current control bits in response to the comparator and a counter control signal.

12. A current control system for a plurality of integrated circuit devices that are commonly attached to a bus including a plurality of signal lines, wherein each integrated circuit includes a plurality of output drivers, a respective one of which drives a respective one of the plurality of signal lines, the current control system comprising:

means in each integrated circuit for setting an output current for each of the output drivers in the integrated circuit; and means for controlling the current setting means in each integrated circuit to simultaneously set an output current for an output driver corresponding to a different one of the plurality of signal lines, such that an output driver in each of the plurality of integrated circuit devices is set simultaneously.

13. A current control system according to claim 12 wherein the means for controlling comprises:

means for storing identity address bits; and means for selecting one of the output drivers in response to the storing means.

14. A current control system according to claim 13 wherein the means for setting comprises:

means for receiving and analyzing a request packet;

means for generating a current control enable signal in response to the means for receiving and analyzing;

means for generating current control bits in response to the current control enable signal and to the means for selecting; and means for controlling the output currents for the plurality of output drivers in response to the current control bits and the address register.

15. A current control system according to claim 12 wherein each of the integrated circuit devices is an integrated circuit memory device.

16. A current control system according to claim 12 wherein each of the integrated circuit devices is a packet type integrated circuit memory device.

17. A current controlling method for a plurality of integrated circuit devices that are commonly attached to a bus including a plurality of signal lines, wherein each integrated circuit includes a plurality of output drivers, a respective one of which drives a respective one of the plurality of signal lines, and wherein each integrated circuit also includes a current setting circuit that sets an output current for each of the output drivers in the integrated circuit, the method comprising the step of:

controlling the current setting circuit in each integrated circuit to set an output current for an output driver corresponding to a different one of the plurality of signal lines, such that an output driver in each of the plurality of integrated circuit devices is set simultaneously.

18. A current controlling method according to claim 17 wherein the controlling step comprises the step of:

storing identity address bits; and selecting one of the output drivers in response to the stored identity bits.

19. A current controlling method according to claim 17 wherein each of the integrated circuit devices is an integrated circuit memory device.

20. A current controlling method according to claim 17 wherein each of the integrated circuit devices is a packet type integrated circuit memory device.

* * * * *